United States Patent
Seamons et al.

(10) Patent No.: US 7,407,893 B2
(45) Date of Patent: Aug. 5, 2008

(54) LIQUID PRECURSORS FOR THE CVD DEPOSITION OF AMORPHOUS CARBON FILMS

(75) Inventors: Martin Jay Seamons, San Jose, CA (US); Wendy H. Yeh, Mountain View, CA (US); Sudha S. R. Rathi, San Jose, CA (US); Deenesh Padhi, Sunnyvale, CA (US); Andy (Hsin Chiao) Luan, Palo Alto, CA (US); Sum-Yee Betty Tang, San Jose, CA (US); Priya Kulkarni, Santa Clara, CA (US); Visweswaren Sivaramakrishnan, Santa Clara, CA (US); Bok Hoen Kim, San Jose, CA (US); Hichem M'Saad, Santa Clara, CA (US); Yuxiang May Wang, Sunnyvale, CA (US); Michael Chiu Kwan, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/065,464

(22) Filed: Feb. 24, 2005

(65) Prior Publication Data

US 2005/0287771 A1    Dec. 29, 2005

Related U.S. Application Data

(63) Continuation-in-part of application No. 10/799,146, filed on Mar. 12, 2004.

(60) Provisional application No. 60/649,344, filed on Feb. 2, 2005, provisional application No. 60/565,639, filed on Apr. 26, 2004, provisional application No. 60/550,386, filed on Mar. 5, 2004.

(51) Int. Cl.
*H01L 21/31* (2006.01)
*H01L 21/461* (2006.01)

(52) U.S. Cl. .................. 438/778; 438/758; 438/759; 438/767

(58) Field of Classification Search ................. 438/636, 438/700, 725, 758, 778, 780, 783, 785, 788
See application file for complete search history.

(56) References Cited

U.S. PATENT DOCUMENTS 4,975,144 A    12/1990  Yamazaki et al.

(Continued)

FOREIGN PATENT DOCUMENTS

DE    103 28 578    2/2004

(Continued)

OTHER PUBLICATIONS

U.S. Appl. No. 10/768,724, filed Jan. 30, 2004.

(Continued)

*Primary Examiner*—Matthew S. Smith
*Assistant Examiner*—Phillip S Green
(74) *Attorney, Agent, or Firm*—Patterson & Sheridan

(57) ABSTRACT

Methods are provided for depositing amorphous carbon materials. In one aspect, the invention provides a method for processing a substrate including positioning the substrate in a processing chamber, introducing a processing gas into the processing chamber, wherein the processing gas comprises a carrier gas, hydrogen, and one or more precursor compounds, generating a plasma of the processing gas by applying power from a dual-frequency RF source, and depositing an amorphous carbon layer on the substrate.

20 Claims, 7 Drawing Sheets

U.S. PATENT DOCUMENTS

| | | | |
|---|---|---|---|
| 5,022,959 A | 6/1991 | Itoh et al. | |
| 5,262,262 A | 11/1993 | Yagi et al. | |
| 5,461,003 A | 10/1995 | Havemann et al. | |
| 5,674,573 A | 10/1997 | Mitani et al. | |
| 5,759,913 A | 6/1998 | Fulford, Jr. et al. | |
| 5,789,320 A | 8/1998 | Andricacos et al. | |
| 5,830,332 A | 11/1998 | Babich et al. | |
| 5,866,920 A | 2/1999 | Matsumoto et al. | |
| 5,882,830 A | 3/1999 | Visser et al. | |
| 5,900,288 A | 5/1999 | Kuhman et al. | |
| 5,930,655 A | 7/1999 | Cooney, III et al. | |
| 5,981,000 A | 11/1999 | Grill et al. | |
| 5,986,344 A | 11/1999 | Subramanion et al. | |
| 5,998,100 A | 12/1999 | Azuma et al. | |
| 6,008,140 A | 12/1999 | Ye et al. | |
| 6,030,901 A | 2/2000 | Hopper et al. | |
| 6,035,803 A * | 3/2000 | Robles et al. | 118/723 E |
| 6,043,167 A | 3/2000 | Lee et al. | |
| 6,054,379 A | 4/2000 | Yau et al. | |
| 6,057,226 A | 5/2000 | Wong | |
| 6,064,118 A | 5/2000 | Sasaki | |
| 6,066,577 A | 5/2000 | Cooney, III et al. | |
| 6,080,529 A | 6/2000 | Ye et al. | |
| 6,098,568 A | 8/2000 | Raoux et al. | |
| 6,140,224 A | 10/2000 | Lin | |
| 6,140,226 A | 10/2000 | Grill et al. | |
| 6,143,476 A | 11/2000 | Ye et al. | |
| 6,153,935 A | 11/2000 | Edelstein et al. | |
| 6,165,890 A | 12/2000 | Kohl et al. | |
| 6,183,930 B1 | 2/2001 | Ueda et al. | |
| 6,184,572 B1 | 2/2001 | Mountsier et al. | |
| 6,197,704 B1 * | 3/2001 | Endo et al. | 438/781 |
| 6,203,898 B1 | 3/2001 | Kohler et al. | |
| 6,211,065 B1 | 4/2001 | Xi et al. | |
| 6,214,637 B1 | 4/2001 | Kim et al. | |
| 6,214,730 B1 | 4/2001 | Cooney, III et al. | |
| 6,235,629 B1 | 5/2001 | Takenaka | |
| 6,291,334 B1 | 9/2001 | Somekh | |
| 6,316,347 B1 | 11/2001 | Chang et al. | |
| 6,323,119 B1 | 11/2001 | Xi et al. | |
| 6,331,380 B1 | 12/2001 | Ye et al. | |
| 6,333,255 B1 | 12/2001 | Sekiguchi | |
| 6,346,747 B1 | 2/2002 | Grill et al. | |
| 6,352,922 B1 | 3/2002 | Kim | |
| 6,358,573 B1 | 3/2002 | Raoux et al. | |
| 6,358,804 B2 | 3/2002 | Kobayashi et al. | |
| 6,380,106 B1 | 4/2002 | Lim et al. | |
| 6,413,852 B1 | 7/2002 | Grill et al. | |
| 6,423,384 B1 | 7/2002 | Khazeni et al. | |
| 6,428,894 B1 * | 8/2002 | Babich et al. | 428/408 |
| 6,458,516 B1 | 10/2002 | Ye et al. | |
| 6,541,397 B1 | 4/2003 | Bencher | |
| 6,541,842 B2 | 4/2003 | Meynen et al. | |
| 6,573,030 B1 | 6/2003 | Fairbairn et al. | |
| 6,596,627 B2 | 7/2003 | Mandal | |
| 6,624,064 B1 | 9/2003 | Sahin et al. | |
| 6,635,583 B2 | 10/2003 | Bencher et al. | |
| 6,653,735 B1 | 11/2003 | Yang et al. | |
| 6,841,341 B2 | 1/2005 | Fairbairn et al. | |
| 6,852,647 B2 | 2/2005 | Bencher | |
| 6,884,733 B1 | 4/2005 | Dakshina-Murthy et al. | |
| 6,913,992 B2 * | 7/2005 | Schmitt et al. | 438/628 |
| 2001/0007788 A1 | 7/2001 | Chang et al. | |
| 2002/0001778 A1 | 1/2002 | Latchford et al. | |
| 2002/0086547 A1 | 7/2002 | Mui et al. | |
| 2002/0090794 A1 | 7/2002 | Chang et al. | |
| 2003/0091938 A1 | 5/2003 | Fairbairn et al. | |
| 2003/0119307 A1 | 6/2003 | Bekiaris et al. | |
| 2003/0186477 A1 * | 10/2003 | Bencher | 438/30 |
| 2004/0023502 A1 | 2/2004 | Tzou et al. | |
| 2004/0038537 A1 | 2/2004 | Liu et al. | |
| 2004/0166691 A1 | 8/2004 | Nieh et al. | |
| 2004/0180551 A1 | 9/2004 | Biles et al. | |
| 2004/0229470 A1 | 11/2004 | Rui et al. | |
| 2005/0202683 A1 * | 9/2005 | Wang et al. | 438/763 |
| 2005/0227502 A1 * | 10/2005 | Schmitt et al. | 438/788 |

FOREIGN PATENT DOCUMENTS

| | | |
|---|---|---|
| EP | 0 381 109 | 1/1990 |
| EP | 0 901 156 | 3/1999 |
| JP | 09 045633 | 2/1997 |
| JP | 11 026578 | 1/1999 |
| WO | WO 00/05763 | 2/2000 |

OTHER PUBLICATIONS

U.S. Appl. No. 10/800,112, filed Mar. 12, 2004.
U.S. Appl. No. 10/799,147, filed Mar. 12, 2004.
U.S. Appl. No. 10/799,146, filed Mar. 12, 2004.
PCT International Search Report for PCT/US05/005855 dated Oct. 13, 2005.
PCT Written Opinion for PCT/US05/005855 dated Oct. 13, 2005.
PCT Notification of Transmittal of the International Search Report dated May 31, 2005 for PCT/US05/008070.
PCT International Preliminary Report on Patentability and Written Opinion for PCT/US2005/005855, dated Sep. 14, 2006.

* cited by examiner

US 7,407,893 B2

LIQUID PRECURSORS FOR THE CVD DEPOSITION OF AMORPHOUS CARBON FILMS

CROSS-REFERENCE TO RELATED APPLICATIONS

This application is a continuation-in-part of U.S. patent application Ser. No. 10/799,146, filed Mar. 12, 2004, and claims benefit of U. S. provisional patent application Ser. No. 60/550,386, filed Mar. 5, 2004, U. S. provisional patent application Ser. No. 60/565,639, filed Apr. 26, 2004, and United States provisional patent application Ser. No. 60/649,344, filed Feb. 2, 2005. Each of the aforementioned related patent applications is herein incorporated by reference.

BACKGROUND OF THE INVENTION

1. Field of the Invention

The invention relates to the fabrication of integrated circuits and to a process for depositing materials on a substrate and to the structures formed by the materials.

2. Description of the Related Art

The fabrication of modern semiconductor devices requires the formation of metal and dielectric layers on a substrate by chemical reaction of gases, referred to as chemical vapor deposition, CVD. Thermal CVD processes supply reactive gases to the substrate surface where energy-induced chemical reactions take place to produce a desired layer.

CVD processes are useful in forming vertical and horizontal interconnects by a damascene or dual damascene method involving the deposition and patterning of one or more material layers. In the damascene method, one or more dielectric materials, such as the low k dielectric materials (i.e., having a dielectric constant (k)<4.0), are deposited and pattern etched to form the vertical interconnects, also known as vias, and horizontal interconnects, also known as lines. Conductive materials, such as those that contain copper, and other materials including barrier layer materials used to prevent diffusion of copper containing materials into the surrounding low k dielectric are then inlaid into the etched pattern. Any excess copper containing material and excess barrier layer material external to the etched pattern, such as on the field of the substrate, is then removed.

However, it has been difficult to produce features with little or no surface defects or feature deformation when low k materials have been used in damascene formation. Low k dielectric materials are often porous and susceptible to being scratched and damaged during removal of conductive materials, thus increasing the likelihood of defects being formed on the substrate surface. Further, low k materials are often brittle and may deform under conventional polishing processes. One solution to limiting or reducing surface defects and deformation is depositing a hardmask over the exposed low k materials prior to patterning and etching feature definitions in the low k materials. The hardmask resists damage and deformation. The hardmask may also protect the underlying low k materials during subsequent material deposition and planarization or material removal processes, such as chemical mechanical polishing techniques or etching techniques, thereby reducing defect formation and feature deformation. The hardmask may then be removed following planarization prior to subsequent processing of the substrate.

Additionally, in the damascene process described above, patterns are formed using conventional lithographic techniques in which a layer of energy sensitive resist is formed over a stack of material layers on a substrate, an image of a pattern is introduced into the energy sensitive resist material, and the pattern introduced into the energy sensitive resist material is transferred into one or more layers of the material stack formed on the substrate using the layer of energy sensitive resist as a mask.

The pattern introduced into the energy sensitive resist can be transferred into one or more layers of the material stack using a chemical etchant. The chemical etchant is designed to have a greater etch selectivity for the material layers of the stack than for the energy sensitive resist. That is, the chemical etchant etches the one or more layers of the material stack at a much faster rate than it etches the energy sensitive resist. The faster etch rate for the one or more material layers of the stack typically prevents the energy sensitive resist material from being consumed prior to completion of the pattern transfer.

As the pattern dimensions are reduced, the thickness of the energy sensitive resist must correspondingly be reduced in order to control pattern resolution. Such thinner resist materials (less than about 6000 Å) can be insufficient to mask underlying material layers during a pattern transfer step using a chemical etchant. A hardmask layer as described above may be used between the energy sensitive resist material and the underlying material layers to facilitate pattern transfer into the underlying material layers. However, in some applications for forming semiconductor structures, it is difficult to remove hardmask materials from the substrate surface and the remaining hardmask material may detrimentally affect semiconductor processing. Further, conventional hardmask materials may not provide sufficient etch selectivity between the material being etched and the hardmask to retain the desired dimensions of the features being formed.

Resist patterning problems are further compounded when lithographic imaging tools having deep ultraviolet (DUV) imaging wavelengths (e. g., less than about 250 nanometers (nm)) are used to generate the resist patterns. The DUV imaging wavelengths improve resist pattern resolution because diffraction effects are reduced at these shorter wavelengths. However, the increased reflective nature of many underlying materials, such as polysilicon, metals, and metal silicides at such DUV wavelengths, can degrade the resulting resist patterns.

One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist. A number of ARC materials have been suggested for use in combination with energy sensitive resists but have had less than satisfactory results. Additionally, some current deposition processes for hardmasks and anti-reflective coating use processes and precursors that have less than desirable step-coverage. Further, ARC materials, like hardmask materials are difficult to remove and may leave residues behind that potentially interfere with subsequent integrated circuit fabrication steps.

Therefore, a need exists in the art for a material layer useful for integrated circuit fabrication, which has good etch selectivity and/or anti-reflective properties and which may further be removed with little or minimal residues.

SUMMARY OF THE INVENTION

Aspects of the invention generally provide a method for depositing amorphous carbon materials. In one aspect, the invention provides a method for processing a substrate including positioning the substrate in a processing chamber, introducing a processing gas into the processing chamber, wherein the processing gas includes one or more hydrocarbon compounds or derivatives thereof, and hydrogen, generating a plasma of the processing gas by applying power from a dual-frequency RF source, and depositing an amorphous carbon layer on the substrate.

In another aspect of the invention, a method is provided for processing a substrate including forming a dielectric material layer on a surface of the substrate, depositing one or more amorphous carbon layers on the dielectric material layer by a process including introducing a processing gas includes one or more hydrocarbon compounds and hydrogen, generating a plasma of the processing gas by applying power from a dual-frequency RF source, etching the one or more amorphous carbon layers to form a patterned amorphous carbon layer, and etching feature definitions in the dielectric material layer corresponding to the patterned one or more amorphous carbon layers.

In another aspect of the invention, a method is provided for processing a substrate including depositing one or more dielectric layers on a substrate surface, wherein at least one of the one or more dielectric layers include silicon, oxygen, and carbon and has a dielectric constant of about 3 or less, forming one or more amorphous carbon layers on the one or more dielectric layers by a process including introducing a processing gas including one or more hydrocarbon compounds or derivatives thereof, and hydrogen, generating a plasma of the processing gas by applying power from a dual-frequency RF source, defining a pattern in at least one region of the one or more amorphous carbon layers, forming feature definitions in the one or more dielectric layer by the pattern formed in the at least one region of the one or more amorphous carbon layers and depositing one or more conductive materials in the feature definitions.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For a further understanding of aspect of the invention, reference should be made to the ensuing detailed description.

DETAILED DESCRIPTION

The words and phrases used herein should be given their ordinary and customary meaning in the art by one skilled in the art unless otherwise further defined. Aspects of the invention generally provide methods for depositing, processing, and removing amorphous carbon material. Amorphous carbon deposition rates and etch selectivity to dielectric materials, such as oxides, may be increased compared to amorphous carbon deposited by conventional amorphous carbon deposition processes by the use of dual frequency RF power sources and the inclusion of hydrogen as a diluent gas and argon as a carrier gas in amorphous carbon processing gases. Amorphous carbon deposition is further described in U.S. Pat. No. 6,573,030, issued on Jun. 3, 2003, entitled, "Method for Depositing an Amorphous Carbon Layer", which is hereby incorporated by reference herein to the extent not inconsistent with the claimed aspects and description herein.

Examples of suitable systems include the CENTURA® systems which may use a DxZ™ processing chamber, PRECISION 5000® systems, PRODUCER™ systems, and the PRODUCER SE™ processing chambers which are commercially available from Applied Materials, Inc., Santa Clara, Calif. The process can be implemented on a 200 mm substrate in a deposition chamber, such as the Producer™ processing chamber, commercially available from Applied Materials, Inc., of Santa Clara Calif. The following deposition processes are described with use of the 300 mm Producer™ dual deposition station processing chamber, commercially available from Applied Materials, Inc., of Santa Clara, Calif., and should be interpreted accordingly, for example, flow rates are total flow rates and should be divided in two to describe the process flow rates at each deposition station in the chamber. Additionally, single deposition chambers, such as the DxZ processing chamber, commercially available from Applied Materials, Inc., of Santa Clara, Calif., may be used to perform the following process with appropriate process conversions, i.e., adjusting flow rated from total dual deposition station Producer™ processing chamber flow rates to single deposition station flow rates.

Example Apparatus

Figure 6:
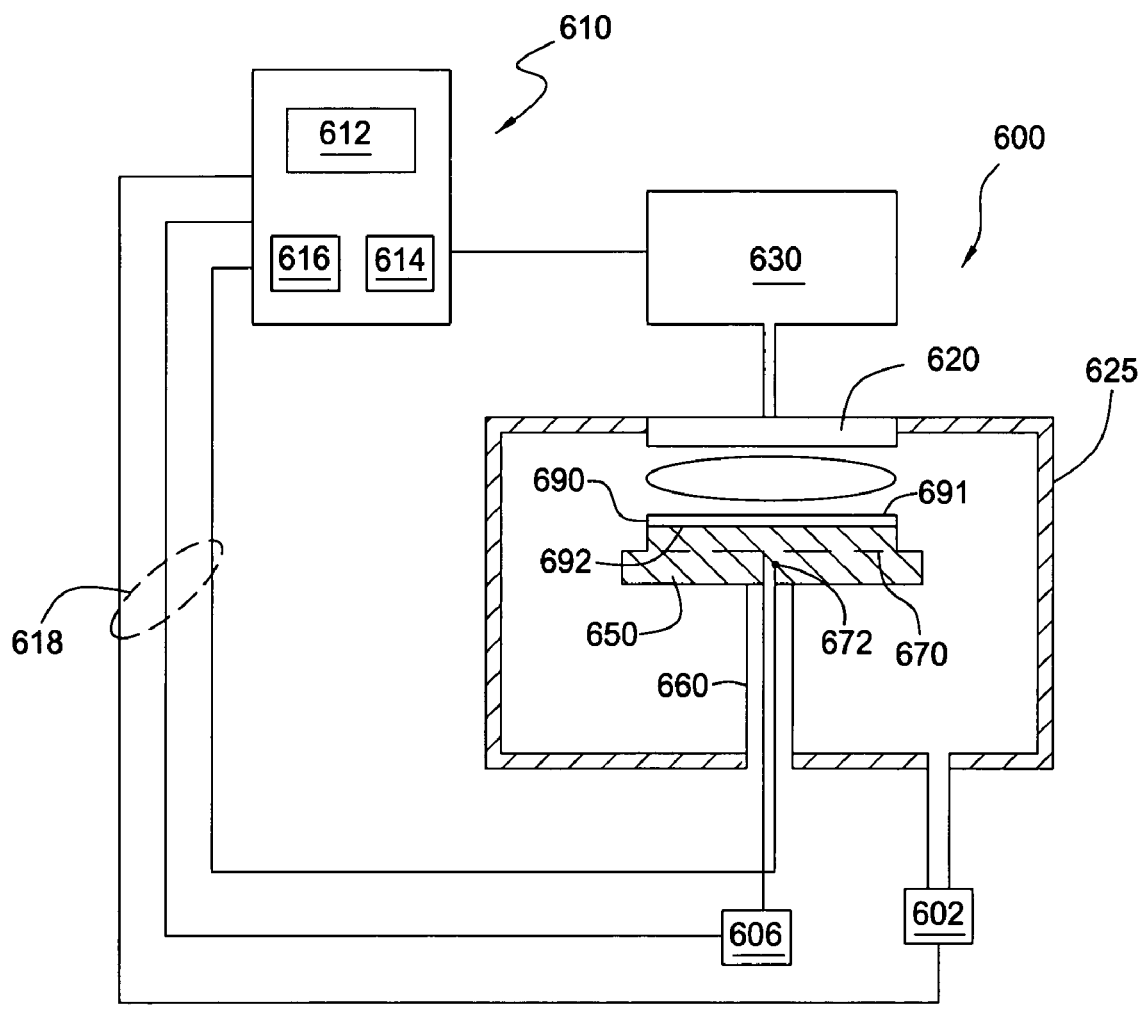
FIG. 6 is a schematic illustration of an apparatus that can be used for the practice of this invention.

FIG. 6 is a schematic representation of a one embodiment of a substrate processing system that can be used to perform amorphous carbon layer deposition. This apparatus comprises a process chamber 625, a gas panel 630, a control unit 610, and other hardware components such as power supplies and vacuum pumps. Details of one embodiment of the system used in the present invention are described in a commonly assigned U.S. patent "High Temperature Chemical Vapor Deposition Chamber", U.S. Pat. No. 6,364,954, issued on Apr. 2, 2002, and is hereby incorporated by reference herein The process chamber 625 generally comprises a support pedestal 650, which is used to support a substrate such as a semiconductor substrate 690. This pedestal 650 moves in a vertical direction inside the chamber 625 using a displacement mechanism (not shown). Depending on the process, the substrate 690 can be heated to a desired. temperature prior to processing. The substrate support pedestal 650 is heated by an embedded heater element 670. For example, the pedestal 650 may be resistively heated by applying an electric current from an AC supply 606 to the heater element 670. The substrate 690 is, in turn, heated by the pedestal 650. A temperature sensor 672, such as a thermocouple, is also embedded in the substrate support pedestal 650 to monitor the temperature of the pedestal 650. The measured temperature is used in a feedback loop to control the power supply 606 for the heating element 670. The substrate temperature can be maintained or controlled at a temperature which is selected for the particular process application. The pedestal 650 is optionally heated using a plasma or by radiant heat.

A vacuum pump 602 is used to evacuate the process chamber 625 and to maintain the proper gas flows and pressure inside the chamber 625. A showerhead 620, through which process gases are introduced into the chamber 625, is located above the substrate support pedestal 650. The showerhead 620 is connected to a gas panel 630, which controls and supplies various gases used in different steps of the process sequence.

The gas panel 630 may also be used to control and supply various vaporized liquid precursors. While not shown, liquid precursors from a liquid precursor supply may be vaporized, for example, by a liquid injection vaporizer, and delivered to the process chamber in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 620 and substrate support pedestal 650 may also form a pair of spaced apart electrodes. When an electric field is generated between these electrodes, the process gases introduced into the chamber 625 are ignited into a plasma. Typically, the electric field is generated by connecting the substrate support pedestal 650 to a source of single-frequency or dual-frequency radio frequency (RF) power (not shown) through a matching network (not shown). Alternatively, the RF power source and matching network may be coupled to the showerhead 620, or coupled to both the showerhead 620 and the substrate support pedestal 650.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

In the present embodiment, amorphous carbon layer deposition is accomplished by plasma enhanced thermal decomposition of a hydrocarbon compound. The hydrocarbon compound is introduced into the process chamber 625 under the control of gas panel 630. The hydrocarbon compound is introduced into the process chamber as a gas with a regulated flow.

Proper control and regulation of the gas and liquid flows through the gas panel 630 is performed by mass flow controllers (not shown) and a controller unit 610 such as a computer. The showerhead 620 allows process gases from the gas panel 630 to be uniformly distributed and introduced into the process chamber 625. Illustratively, the control unit 610 comprises a central processing unit (CPU) 612, support circuitry 614, and memories containing associated control software 616. This control unit 610 is responsible for automated control of the numerous steps required for substrate processing—such as substrate transport, gas flow control, liquid flow control, temperature control, chamber evacuation, and so on. Bi-directional communications between the control unit 610 and the various components of the apparatus are handled through numerous signal cables collectively referred to as signal buses 618, some of which are illustrated in FIG. 6.

The heated pedestal 650 used in the present invention is made of aluminum and includes a heating element 670 embedded at a distance below the substrate support surface of the pedestal 650. The heating element 670 can be made of a nickel-chromium wire encapsulated in an Incoloy™ sheath tube. By properly adjusting the current supplied to the heating element 670, the substrate 690 and the pedestal 650 can be maintained at a relatively constant temperature during film deposition. This is accomplished by a feedback control loop, in which the temperature of the pedestal 650 is continuously monitored by a thermocouple 672 embedded in the pedestal 650. This information is transmitted to the control unit 610 via a signal bus 618, which responds by sending the necessary signals to the heater power supply. Adjustment is subsequently made in the current supply 606 so as to maintain and control the pedestal 650 at a desirable temperature, for example, a temperature that is appropriate for the specific process application. When the process gas mixture exits the showerhead 620, plasma enhanced thermal decomposition of the hydrocarbon compound occurs at the surface 691 of the heated substrate 690, resulting in a deposition of an amorphous carbon layer on the substrate 690.

Deposition Process

An amorphous carbon layer may be deposited by a process including introducing a gas mixture of one or more hydrocarbon compounds, or derivatives thereof, into a processing chamber. Additionally, oxygen containing compounds may be used. The hydrocarbon compounds may optionally contain nitrogen or be deposited with a nitrogen-containing gas, such as ammonia. Also, the hydrocarbon compounds may have substituents such as fluorine and oxygen. The hydrocarbon compound or its derivative has a formula $C_AH_BO_CF_D$, where A has a range of between 1 and 24, B has a range of between 0 and 50, C has a range of 0 to 10, D has a range of 0 to 50, and the sum of B and D is at least 2.

Examples of suitable hydrocarbon compounds are saturated or unsaturated aliphatic or alicyclic hydrocarbons and aromatic hydrocarbons. More specifically, aliphatic hydrocarbons include, for example, alkanes such as methane, ethane, propane, butane, pentane, hexane, heptane, octane, nonane, decane, and the like; alkenes such as ethylene, propylene, butylene, pentene, and the like; dienes such as butadiene, isoprene, pentadiene, hexadiene and the like; alkynes such as acetylene, vinylacetylene and the like. Alicyclic hydrocarbons include, for example, cyclopropane, cyclobutane, cyclopentane, cyclopentadiene, toluene, and the like. Aromatic hydrocarbons include, for example, benzene, styrene, toluene, xylene, pyridine, ethylbenzene, acetophenone, methyl benzoate, phenyl acetate, phenol, cresol, furan, and the like. Additionally, alpha-terpinene, cymene, 1,1,3,3,-tetramethylbutylbenzene, t-butylether, t-butylethylene, methyl-methacrylate, and t-butylfurfurylether may be selected.

Examples of suitable derivatives of hydrocarbon compounds are fluorinated alkanes, halogenated alkanes, and halogenated aromatic compounds. Fluorinated alkanes include, for example, monofluoromethane, difluoromethane, trifluoromethane, tetrafluoromethane, monofluoroethane, tetrafluoroethanes, pentafluoroethane, hexafluoroethane, monofluoropropanes, trifluoropropanes, pentafluoropropanes, perfluoropropane, monofluorobutanes, trifluorobutanes, tetrafluorobutanes, octafluorobutanes, difluorobutanes, monofluoropentanes, pentafluoropentanes, tetrafluorohexanes, tetrafluoroheptanes, hexafluoroheptanes, difluorooctanes, pentafluorooctanes, difluorotetrafluorooctanes, monofluorononanes, hexafluorononanes, difluorodecanes, pentafluorodecanes, and the like. Halogenated alkenes include monofluoroethylene, difluoroethylenes, trifluoroethylene, tetrafluoroethylene, monochloroethylene, dichloroethylenes, trichloroethylene, tetrachloroethylene, and the like. Halogenated aromatic compounds include monofluorobenzene, difluorobenzenes, tetrafluorobenzenes, hexafluorobenzene and the like.

It is believed that hydrocarbon compounds or derivatives having at least 5 carbon atoms are liquids at room temperature, approximately 20° C., and provide enhanced film coverage, such as step coverage, and improved conformality over prior amorphous carbon deposition processes. It is further believed that the liquid precursors have larger molecules and species that form meta-stable intermediate species that absorb on the wafer surface and have some mobility over topography and, thus, have improved step coverage.

Alternatively, partially or completely doped derivatives of the hydrocarbon compounds may be used. The derivatives include nitrogen, fluorine, oxygen, hydroxyl group, and boron-containing derivatives of the hydrocarbon compounds as well as fluorinated derivatives thereof. Suitable fluorine based compounds include fluorine ($F_2$), inorganic compound fluorine derivatives, such as nitrogen trifluoride ($NF_3$), partially or completely fluorinated derivatives of hydrocarbon compounds, and combinations thereof. The fluorinated hydrocarbons compounds have a formula $C_xH_yF_z$, where x is greater than 5, such as a range of between 5 and 20, y has a range of between 0 and 18, z has a range of between 0 and 42, with y+z greater than or equal to 2 and less than or equal to 62. Examples include fully fluorinated hydrocarbons, such as $C_3F_8$, or $C_4F_8$, and $C_6F_6$, which may be used to deposit a fluorinated amorphous carbon layer, which may be described as an amorphous fluorocarbon layer. A combination of hydrocarbon compounds and doped derivatives of hydrocarbon compounds may be used to deposit the amorphous carbon layer or amorphous fluorocarbon layer.

One or more fluorine containing compounds can be introduced during the amorphous carbon deposition process or as an intermediary step to increase carbon concentration of the deposited amorphous carbon materials. Flourine may be added before, during, or intermediately during the deposition process for amorphous carbon. Other halide compounds, such as chlorine based compounds and bromine based compounds may also be used. Fluorine based compounds may be introduced during the deposition process or as an intermediary step. The fluorine based compounds may be introduced with the hydrocarbon compounds during the entire deposition process, a portion of the deposition process, or periodically or cyclically during the deposition process.

Fluorine based compounds may be introduced during 100% of the hydrocarbon introduction. Alternatively, while fluorine based compounds are continuously added to the hydrocarbon compounds during the deposition cycle, the fluorine based compound concentration may be increased or decreased periodically or cyclically, such as two or three cycles during deposition of the amorphous carbon layer.

Fluorine based compounds may be introduced during a portion of the deposition process, such as between about 40% to 60% of the deposition cycle, or, for example, during the middle portion of the deposition cycle, such as such as during about 40% to 60% of the duration of the deposition cycle. Further, when applying fluorine based compounds for a portion of the process, fluorine based compounds may be introduced periodically or cyclically, such as two or three cycles during deposition of the amorphous carbon layer.

In a further embodiment, the flow of hydrocarbons may be ended and a flow of fluorine based compounds may be introduced into the processing chamber as an intermediary treatment step of the deposited amorphous carbon materials prior to reintroducing hydrocarbon compounds and further deposition of amorphous carbon material. Additionally, a similar effect may be achieved by modifying the concentrations of the fluorine based compound and the hydrocarbon compounds, for example, an initial process step having a high hydrocarbon concentration and low fluorine based compounds concentration, a step having a low hydrocarbon concentration and a high fluorine based compound concentration, and then a final step or further cyclical step having a high hydrocarbon concentration and low fluorine based compound concentration.

Additionally, fluorine may be added prior to introducing the processing gas for amorphous carbon deposition. In such as embodiment, the fluorine gas may be used to clean the processing chamber as well as provide a fluorine rich environment for introduction of the amorphous carbon processing gas. The presence of the fluorine pre-treatment may be used with, or as an alternative to, fluorine in the amorphous carbon processing gas.

It is believed that the introduction of fluorine based compounds allows for an increase in the atomic concentration of carbon in the deposited amorphous carbon layer as the fluorine in the fluorine based compounds react and remove, i.e., scavenges, hydrogen from the deposition process and deposited material. It has been observed that increased carbon concentration in the deposited amorphous carbon layers results in increase absorbance (k, extinction coefficient) of 157 nm to 900 nm wavelengths used in conventional lithographic processes for semiconductor manufacture. Increase absorbance results in increased ARC effectiveness. Further, the fluorine presence allows for effective amorphous carbon deposition at temperature of about 550° C. or less, which is less than some conventional amorphous carbon deposition process, and within the thermal budgets of most material used in semiconductor manufacturing.

Alternatively, the one or more hydrocarbon compounds may be mixed with or introduced with a hydrocarbon compound having less than 5 carbon atoms such as a hydrocarbon compound having the formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$) as well as combinations thereof, may be used with the hydrocarbon compounds described herein.

Preferably, methane, ethane, ethylene, propylene ($C_3H_6$), propyne ($C_3H_4$), propane ($C_3H_8$), butane ($C_4H_{10}$), butylene ($C_4H_8$), butadiene ($C_4H_6$), acetylene ($C_2H_2$), pentane, pentene, pentadiene, cyclopentane, cyclopentadiene benzene, toluene, alpha-terpinene, phenol, and cymene, and combinations thereof may be used to deposit amorphous carbon layers.

A mixture of reactive gases and inert gases may be added to the processing gas to deposit an amorphous carbon layer. Inert gases may include argon (Ar) and helium (He). Inert gases may be used to control the density and deposition rate of the amorphous carbon layer.

Additionally, a variety of processing gases may be added to the gas mixture to modify properties of the amorphous carbon material. Hydrogen (H2) is added to the processing gases to modify properties of the amorphous carbon material. Also, the hydrocarbon compounds may contain nitrogen or be deposited with a nitrogen-containing gas, such as ammonia. The gases may be reactive gases, such as hydrogen ($H_2$), ammonia ($NH_3$), a mixture of hydrogen ($H_2$) and nitrogen ($N_2$), fluorine based compounds, or combinations thereof. The addition of $H_2$ and/or $NH_3$ can be used to control the hydrogen ratio of the amorphous carbon layer to control layer properties, such as reflectivity.

In order to deposit amorphous fluorocarbon layers, a fluorine based compound is preferably introduced at a flow rate ratio to a hydrocarbon compound between about 1:20 (fluorine based compound:hydrocarbon compound) and about 2:1, for example, between about 1:20 and about 1:5. The fluorine based compound may be introduced with or without the hydrocarbon compound into the processing chamber at a flow rate between about 50 sccm and about 3000 sccm, for example, between about 100 sccm and about 2000 sccm. The processing gas may further include a carrier or inert gas, for example nitrogen, helium, or argon, at a flow rate of between about 50 sccm and about 10000 sccm, for example, between about 500 sccm and about 5000 sccm.

The amorphous carbon layer comprises carbon and hydrogen atoms, which may have an adjustable carbon:hydrogen ratio that ranges from about 10% hydrogen to about 60% hydrogen. Controlling the hydrogen ratio of the amorphous carbon layer is desirable for tuning the respective optical properties, etch selectivity, and chemical mechanical polishing resistance properties. It is believed that a higher concentration of hydrogen is desirable in the mixture of reactive gases because hydrogen has a low ionization threshold compared to helium or argon and hydrogen can diffuse faster into the surface of the deposited film because it has a lower molecular weight. Hydrogen ions ($H^+$) have a depth of penetration that is ten times the depth of penetration of methyl group ions ($CH_x^+$). Hydrogen is also desirable because it prevents localization of plasma that can cause arcing on the substrate and it helps spread the plasma laterally and improve the resulting film uniformity.

In hardmask applications, as the hydrogen content decreases, the etch resistance, and thus the selectivity, of the amorphous carbon layer increases. The hardmask provides a selectivity, or removal rate ratio, of amorphous carbon to dielectric material of greater than about 1:10, such as greater than 1:10 and less than or equal to 1:20. The reduced rate of removal of the amorphous carbon layer, which defines the features being etched into the conductive material, allows for effective dielectric material etch without loss of the amorphous carbon layer. The amorphous carbon layer deposited by the process herein was observed to have an etch selectivity improvement of between about 5% and about 20% greater than helium deposited amorphous carbon materials.

In anti-reflective coating applications, control of the content of the amorphous carbon layer and the process for depositing the amorphous carbon layer can result in control of anti-reflective coating properties. For example, as the hydrogen content decreases, the optical properties of the as-deposited layer such as for example, the index of refraction (n) and the absorption coefficient (k) increase.

The light absorption coefficient, k, of the amorphous carbon layer can be varied between about 0.1 to about 1.0 at wavelengths below about 250 nm, such as between about 193 nm and about 250 nm, making the amorphous carbon layer suitable for use as an anti-reflective coating (ARC) at DUV wavelengths. Additionally, control of the content of the amorphous carbon layer used in anti-reflective coating applications and the process for depositing the amorphous carbon layer can provide control of the resulting anti-reflective coating properties. For example, as the hydrogen content decreases the optical properties of the as-deposited layer such as the index of refraction (n) and the absorption coefficient (k) increase.

The absorption coefficient of the amorphous carbon layer can be varied as a function of the deposition temperature. In particular, as the temperature increases the absorption coefficient of the deposited layer likewise increases. For example, when propylene is the hydrocarbon compound the k value for the deposited amorphous carbon layers can be increased from about 0.2 to about 0.7 by increasing the deposition temperature from about 150° C. to about 480° C. Typically, the amorphous carbon layer has a thickness of about 200 Å to about 1100 Å. Decreasing the temperature of deposition decreases the likelihood of formation of carbon carbon double bonds. Decreasing the likelihood of carbon carbon double bond formation may increase the resulting film transparency and decrease the dielectric constant.

The absorption coefficient of the amorphous carbon layer can also be varied as a function of the additive used in the gas mixture. In particular, the presence of hydrogen ($H_2$), ammonia ($NH_3$), and nitrogen ($N_2$), or combinations thereof, in the gas mixture can increase the k value by about 10% to about 100%. The amorphous carbon layer is further described in U.S. patent application Ser. No. 09/590,322, filed on Jun. 8, 2000, entitled, "Method for Depositing an Amorphous Carbon Layer", which is incorporated herein to the extent not inconsistent with the claimed aspects and description herein.

Additionally, the absorption coefficient can be varied as a function of the pressure of the deposition chamber. Lower pressure in the deposition chamber increases the mean free path of the ions in the chamber. As the ions travel near the surface of the substrate, they experience increased activity as they interact with the atoms along the surface of the substrate. Pressure in the chamber can be varied from about 1 Torr to about 10 Torr. It is believed that increasing pressure in the chamber during film deposition will decrease the resulting film density.

In an alternate embodiment, the amorphous carbon layer can have an absorption coefficient (k) that varies across the thickness of the layer. That is, the amorphous carbon layer can have an absorption coefficient gradient formed therein. The gradient is formed as a function of variations of the temperature and the composition of the gas mixture during layer formation.

At any interface between two material layers, reflections can occur because of differences in their refractive indices (n) and absorption coefficients (k). When the amorphous carbon ARC has a gradient, it is possible to match the refractive indices (n) and the absorption coefficients (k) of the two material layers so there is minimal reflection and maximum transmission into the amorphous carbon ARC. Then the refractive index (n) and absorption coefficient (k) of the amorphous carbon ARC can be gradually adjusted to absorb all of the light transmitted therein.

The amorphous carbon layer may be deposited with two or more layers having different optical properties. For example, an amorphous carbon bi-layer may include a first amorphous carbon layer according to the process parameters described above and is designed primarily for light absorption. As such, the first amorphous carbon layer has an index of refraction in the range of about 1.5 to about 1.9 and an absorption coefficient (k) in the range of about 0.5 to about 1.0 at wavelengths less than about 250 nm. A second amorphous carbon layer, an anti-reflective coating layer is formed on the first amorphous carbon layer according to the process parameters described above to have an index of refraction between about 1.5 and about 1.9, and an absorption coefficient between about 0.1 and about 0.5. The second amorphous carbon layer is designed primarily for phase shift cancellation by creating reflections that cancel those generated at the interface with an overlying material layer, such as an energy sensitive resist material, for example, a resist. The refractive index (n) and the absorption coefficient (k) of the first and second amorphous carbon layers are tunable, in that they can be varied as a function of the temperature as well as the composition of the gas mixture during layer formation.

Optional removal of the amorphous carbon material from the dielectric material may be achieved by subjecting the amorphous carbon layer to a plasma of a hydrogen-containing gas, nitrogen-containing, and/or an oxygen-containing gas. The plasma of the hydrogen-containing gas and/or the oxygen-containing gas is believed to remove the amorphous carbon material with minimal effect of the dielectric material disposed thereunder or of the surface roughness of the core material disposed thereunder.

The amorphous carbon deposition process may be a thermal chemical vapor deposition process or a plasma enhanced chemical vapor deposition process. The amorphous carbon layer may deposited from the processing gas by maintaining a substrate temperature between about 100° C. and about 700° C., such as below 450° C., maintaining a chamber pressure between about 1 Torr and about 20 Torr, introducing the hydrocarbon gas, and any inert or reactive gases respectively, at a flow rate between about 50 sccm and about 2000 sccm for a 200 mm substrate, optionally, a plasma is generated by applying a RF power of between about 0.03 W/cm$^2$ and about 20 W/cm$^2$, or between about 10 watts (W) and about 6000 W, for example between about 0.3 W/cm$^2$ and about 3 W/cm$^2$, or between about 100 W and about 1000 W for a 200 mm substrate, with a gas distributor being between about 200 mils and about 1000 mils from the substrate surface. The above process parameters provide a deposition rate for the amorphous carbon layer in the range of about 100 Å/min to about 5000 Å/min.

Preferably, a dual-frequency system is used to deposit the amorphous carbon material. The dual frequency is believed to provide independent control of flux and ion energy. It is believed the energy of the ions hitting the film surface influences the film density. The higher rate of surface bombardment by the hydrogen ions yields a higher rate of hydrogen removal from the film surface. The high frequency plasma controls plasma density. The low frequency plasma controls kinetic energy of the ions hitting the wafer surface. A dual-frequency source of mixed RF power provides a high frequency power in a range between about 10 MHz and about 30 MHz, for example, about 13.56 MHz, as well as a low frequency power in a range of between about 10 KHz and about 1 MHz, for example, about 350 KHz. An example of a mixed frequency RF power application may include a first RF power with a frequency in a range of about 10 MHz and about 30 MHz at a power in a range of about 200 watts to about 1600 watts and a power density of about 0.27 W/cm$^2$ to about 1.7 W/cm$^2$ and at least a second RF power with a frequency in a range of between about 10 KHz and about 1 MHz as well as a power in a range of about 1 watt to about 1000 watts and a power density of about 0.27 W/cm$^2$ to about 1.4 W/cm$^2$. The ratio of the second RF power to the total mixed frequency power is preferably less than about 0.6 to 1.0 (0.6:1). The applied RF power and use of one or more frequencies may be varied based upon the substrate size and the equipment used.

The high frequency RF power and the low frequency RF power may be coupled to a gas distributor (showerhead) or a substrate support, or one may be coupled to the showerhead and the other to the support pedestal. Details of the mixed RF power source 119 are described in commonly assigned U.S. Pat. No. 6,041,734, entitled, "Use of an Asymmetric Waveform to Control Ion Bombardment During Substrate Processing", issued on Mar. 28, 2000, and is herein incorporated by reference.

The post plasma treatment generally includes providing the hydrogen containing gas including hydrogen, ammonia, water vapor (H$_2$O), or combinations thereof, to a processing chamber at a flow rate between about 100 sccm and about 8000 sccm, preferably between about 500 sccm and about 2500 sccm, and generating a plasma in the processing chamber. The plasma may be generated using a power density ranging between about 0.15 W/cm$^2$ and about 5 W/cm$^2$, which is a RF power level of between about 50 W and about 1500 W for a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle.

The plasma treatment may be performed by maintaining a chamber pressure of between about 1 Torr and about 10 Torr, preferably between about 3 Torr and about 8 Torr, maintaining the substrate at a temperature between about 100° C. and about 300° C. during the plasma treatment, preferably, between about 200° C. and about 300° C., for between about 15 seconds and about 120 seconds, or as necessary to remove the amorphous carbon material with the gas distributor positioned between about 100 mils and about 2000 mils from the substrate surface, preferably positioned between about 200 mils and about 1000 mils, during the plasma treatment. However, it should be noted that the respective parameters may be modified to perform the plasma processes in various chambers and for different substrate sizes, such as between 200 mm and 300 mm substrates. Alternatively, the plasma treatment process parameters may be the same or substantially the same as the material deposition process parameters.

The above process parameters provide a typical deposition rate for the amorphous carbon layer in the range of about 100 Å/min to about 1000 Å/min and can be implemented on a 300 mm substrate in a deposition chamber, such as the Producer™ processing chamber commercially available from Applied Materials, Inc.

A suitable reactor for performing the amorphous carbon material deposition and the hydrogen-containing gas plasma removal of the amorphous carbon materials described herein may be performed in a Producer™ processing chamber or a DxZ™ chemical vapor deposition chamber commercially available from Applied Materials, Inc., Santa Clara, Calif.

Hardmask/Anti-Reflective Coating (ARC) Application

Figure 1A:
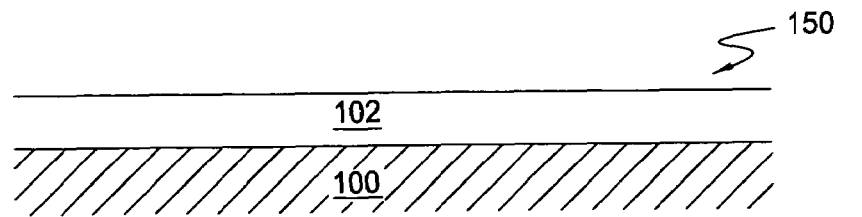
FIGS. 1A-1E are cross sectional views showing one embodiment of an amorphous carbon deposition process.

FIGS. 1A-1E illustrate schematic cross-sectional views of one embodiment of a substrate 100 at different stages of an integrated circuit fabrication sequence incorporating an amorphous carbon layer as a hardmask. In general, the substrate 100 refers to any workpiece on which processing is performed, and a substrate structure 150 is used to generally denote the substrate 100 together with other material layers formed on the substrate 100. Depending on the specific stage of processing, the substrate 100 may correspond to a silicon substrate, or other material layer that has been formed on the substrate. FIG. 1A, for example, illustrates a cross-sectional view of a substrate structure 150 having a material layer 102 that has been conventionally formed thereon. The material layer 102 may be an oxide (e.g., SiO$_2$). In general, the substrate 100 may include a layer of silicon, silicides, metals or other materials.

Figure 1B:
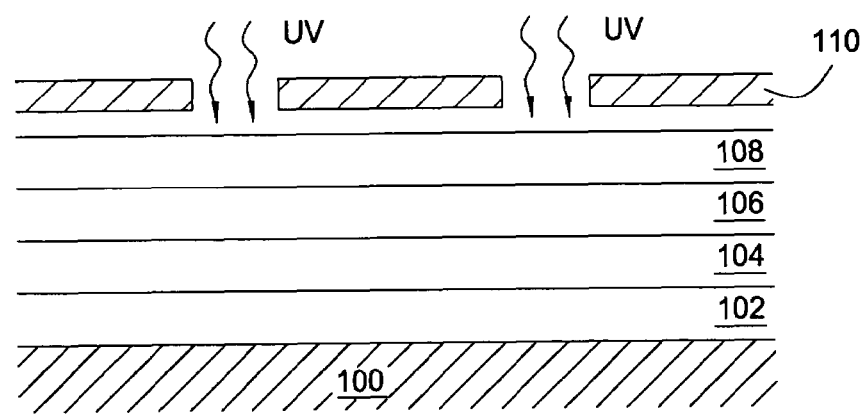

FIG. 1B depicts an amorphous carbon layer 104 deposited on the substrate structure 150 of FIG. 1A. The amorphous carbon layer 104 is formed on the substrate structure 150 according to the process parameters described above. The thickness of the amorphous carbon layer is variable depending on the specific stage of processing. Typically, the amorphous carbon layer has a thickness in the range of about 50 Å to about 1000 Å.

Depending on the etch chemistry of the energy sensitive resist material used in the fabrication sequence, an optional capping layer 106 may be formed on the amorphous carbon layer 104. The optional capping layer 106 functions as a mask for the amorphous carbon layer 104 when the pattern is transferred therein. The optional capping layer 106 may comprise a material including an oxide, such as silicon oxide, a nitride, such as silicon nitride or titanium nitride, silicon oxynitride, silicon carbide, amorphous silicon, undoped silica glass (USG), doped silicon oxide, or other materials. The optional capping layer 106 may be deposited to a thickness between about 100 Å and about 1000 Å, but layer thickness may vary depending on process requirements. The cap layer is believed to protect the amorphous carbon layer from the photoresist as well as cover any layer imperfections, such as pinholes formed in the amorphous carbon material.

A layer of energy sensitive resist material 108 is formed on the optional capping layer 106. The layer of energy sensitive resist material 108 can be spin coated on the substrate to a thickness within the range of about 2000 Å to about 6000 Å. Most energy sensitive resist materials are sensitive to ultraviolet (UV) radiation having a wavelength less than about 450 nm. DUV resist materials are sensitive to UV radiation having wavelengths of 245 nm or 193 nm.

Figure 1C:
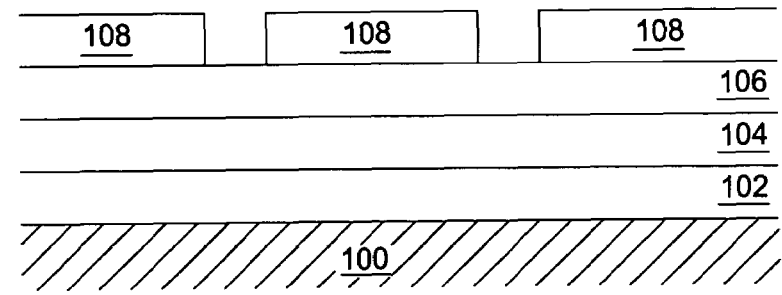

An image of a pattern is introduced into the layer of energy sensitive resist material 108 by exposing such energy sensitive resist material 108 to UV radiation via mask 110. The image of the pattern introduced in the layer of energy sensitive resist material 108 is developed in an appropriate developer to define the pattern through such layer as shown in FIG. 1C.

Figure 1D:
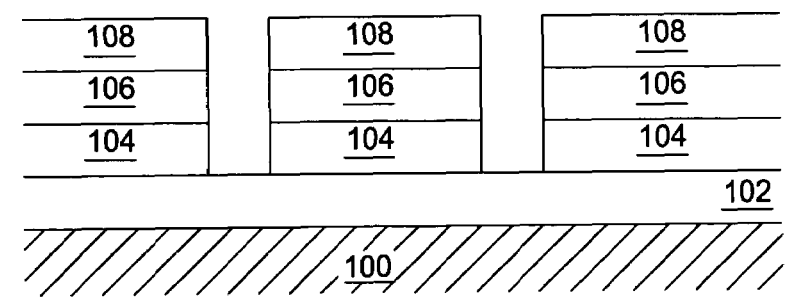
Figure 1E:
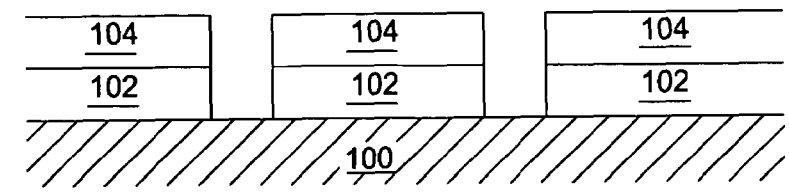

Thereafter, referring to FIG. 1D, the pattern defined in the energy sensitive resist material 108 is transferred through both the optional capping layer 106 and the amorphous carbon layer 104. The pattern is transferred through the optional capping layer 106 using the energy sensitive resist material 108 as a mask. The pattern is transferred through the optional capping layer 106 by etching the optional capping layer 106 using an appropriate chemical etchant. The pattern is then transferred through the amorphous carbon layer 104 using the optional capping layer 106 as a mask, using an appropriate chemical etchant (e. g., ozone, oxygen or ammonia plasmas), and then through the material layer 102 using the amorphous carbon layer 104 as a hardmask as shown in FIG. 1E. After the material layer 102, i.e. silicon dioxide, is patterned, the amorphous carbon layer 104 can optionally be stripped from the substrate 100 as described herein.

In a specific example of a fabrication sequence, the pattern defined in the amorphous carbon hardmask can be incorporated into the structure of the integrated circuit, such as a damascene structure. Damascene structures are typically used to form metal interconnects on integrated circuits.

Conductive Feature Formation

An example of a conductive or dielectric feature formed with amorphous carbon as an etch stop and/or anti-reflective coating (ARC) and the amorphous carbon material removal process described herein is shown in FIGS. 2A-2E, which are cross sectional views of a substrate having the steps of the invention formed thereon.

Figure 2A:
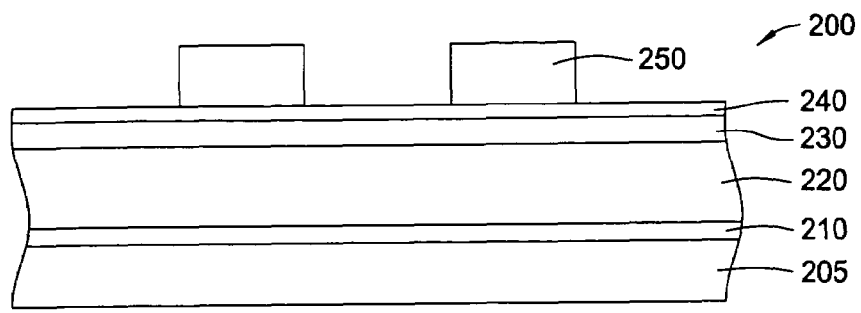
FIGS. 2A-2E are cross sectional views showing one embodiment of a deposition sequence of the invention.

As shown in FIG. 2A, an optional barrier layer 210 is deposited on the substrate surface to eliminate inter-level diffusion between the substrate 200 and subsequently deposited material. The substrate surface 205 may comprise a dielectric or conductive material, and while not shown, the substrate surface 205 may comprise metal features formed in a dielectric material. The barrier layer 210 may be deposited to a thickness of about 100 Å to about 1000 Å.

The barrier layer 210 may comprise any conventional barrier layer material including, for example, silicon nitride, silicon oxynitride, or combinations thereof. The barrier layer may also include a low dielectric constant material, such as silicon carbide or nitrogen containing silicon carbide having a dielectric constant of about 5 or less. An example of a low k material is BLOk™ dielectric material commercially available from Applied Materials, Inc., of Santa Clara, Calif.

A dielectric material layer 220 is deposited on the barrier layer 210. The dielectric material layer may include silicon oxide-based materials for use in, for example, shallow trench isolation (STI) deposition processes. Examples of dielectric material include silicon oxides, doped silicon oxides, such as PSG, PBSG, and carbon doped silicon oxides as examples. An example of a low k material is Black Diamond™ dielectric material commercially available from Applied Materials, Inc., of Santa Clara, Calif.

An amorphous carbon layer 230 is then deposited on the dielectric material layer 220. Typically, the amorphous carbon layer has a thickness in the range of about 50 Å to about 1000 Å. The amorphous carbon layer 230 is a hardmask which may perform as a stop for chemical mechanical polishing techniques to allow selective removal of materials while protecting underlying materials, such as the dielectric material layer 220, from damage during etching or from polishing methods.

The amorphous carbon layer 230 may also perform as an etch stop and allow for selective removal of the underlying dielectric material and/or as an anti-reflective coating. The light absorption coefficient, k, of the amorphous carbon layer can be varied between about 0.1 to about 1.0 at wavelengths below about 250 nm, such as between about 193 nm and about 250 nm, making the amorphous carbon layer suitable for use as an anti-reflective coating (ARC) at DUV wavelengths. Typically, the amorphous carbon layer 230 has a thickness of about 200 Å to about 10,000 Å.

Optionally, an anti-reflective coating 240 may be deposited on the amorphous carbon layer 230. The anti-reflective coating may comprise a material selected from the group consisting of an oxide, nitride, silicon oxynitride, silicon carbide, amorphous silicon, and combinations thereof. The anti-reflective coating 240 may function as a hardmask for the amorphous carbon layer 230 when the pattern is transferred therein.

Alternatively, the anti-reflective coating 240 may comprise another amorphous carbon layer. If the anti-reflective coating 240 is an amorphous carbon layer, the amorphous carbon bi-layer may include a first amorphous carbon layer 230 according to the process parameters described above and is designed primarily for light absorption. As such, the first amorphous carbon layer 230 has an index of refraction in the range of about 1.2 to about 1.9 and an absorption coefficient (k) in the range of about 0.3 to about 1.0 at wavelengths less than about 250 nm. The thickness of the first amorphous carbon layer 230 is variable depending on the specific stage of processing. Typically, the first amorphous carbon layer 230 has a thickness in the range of about 300 Å to about 10,000 Å.

A second amorphous carbon layer, the anti-reflective coating layer 240, is formed on the first amorphous carbon layer 230 according to the process parameters described above to have an index of refraction between about 1.2 and about 1.9, and an absorption coefficient between about 0.01 and about 0.5. The second amorphous carbon layer is designed primarily for phase shift cancellation by creating reflections that cancel those generated at the interface with an overlying material layer, such as an energy sensitive resist material, for example, a resist. The thickness of the second amorphous carbon layer is also variable depending on the specific stage of processing, for example, between about 200 Å and about 700 Å. The refractive index (n) and the absorption coefficient (k) of the first and second amorphous carbon layers are tunable, in that they can be varied as a function of the temperature and power as well as the composition of the gas mixture during layer formation.

An energy resist material, such as a resist material 250, is deposited and patterned on the surface of the amorphous carbon material. The resist material 250 can be spin coated on the substrate to a thickness within the range of about 200 Å to about 6000 Å. Photoresist materials are sensitive to ultraviolet (UV) radiation having a wavelength less than about 450 nm. DUV resist materials are sensitive to UV radiation having wavelengths of 245 nm or 193 nm. An image of a pattern is introduced into the layer of resist material 250 by exposure to UV radiation via a photolithographic reticle. The image of the pattern introduced in the layer of resist material 250 is developed in an appropriate developer to define the pattern as shown in FIG. 2A.

Figure 2B:
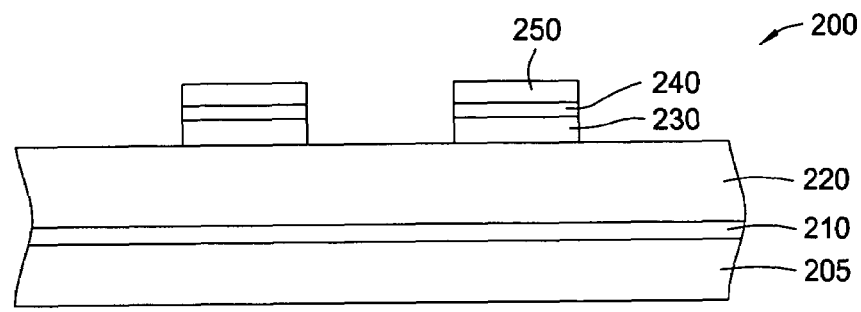
Figure 2C:
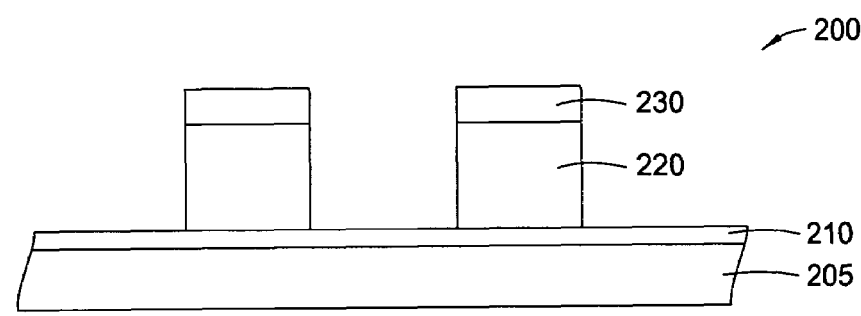

The pattern defined in the resist material 250 is transferred through the amorphous carbon layer 230 and any intervening layer, such as anti-reflective coating 240 as shown in FIG. 2B. The pattern is transferred through the amorphous carbon layer 230 and any intervening layer by etching using an appropriate chemical etchant. For example, ozone, oxygen or ammonia plasmas may be used to etch amorphous carbon materials. Multiple etching steps including variable etching gas composition may be use to etch through the amorphous carbon layer 230 and any intervening layer. Optionally, any remaining resist material after the etching process may be removed prior to further processing.

Figure 2D:
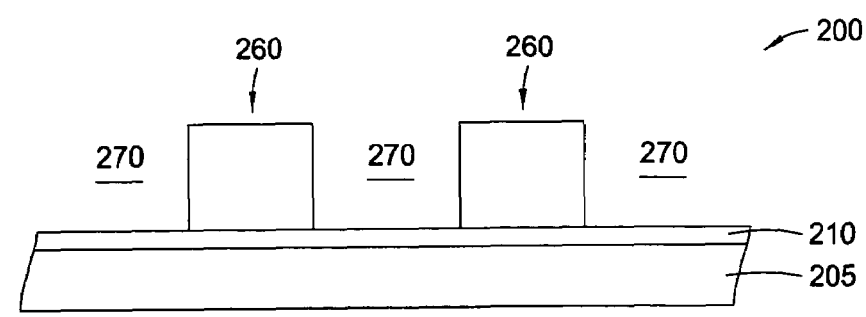

The pattern formed in the amorphous carbon layer 230 may then be transferred to the dielectric material layer 220 and any intervening layer by etching using an appropriate chemical etchant to form features 260 as shown in FIG. 2D. Any known conductive material etchant may be used to etch the conductive material 120.

The amorphous carbon layer 230 may then be exposed to a plasma of a hydrogen-containing gas to remove the amorphous containing material from the surface of the substrate. An example of the hydrogen-containing plasma removal process may be performed by introducing hydrogen gas at a flow rate of about 1000 sccm, maintaining a chamber pressure of about 5 Torr, maintaining a substrate temperature at about 250° C., generating a plasma by supplying a RF power level of between about 100 W and about 300 W for a 200 mm substrate, and maintaining the plasma for about 60 seconds, or as necessary to remove the amorphous carbon material. The gas distributor is positioned about 500 mils from the substrate surface during the plasma treatment as shown in FIG. 2D. Any remaining intervening materials, such as the ARC material, are removed by the etchant or by the amorphous carbon removal process. The invention contemplates that a separate removal process for the ARC layer may be necessary to remove such layer residues prior to amorphous carbon removal.

Conductive features may then be formed in the feature definitions 270 between the features 260 by bulk deposition. The conductive material may comprise a metal, such as aluminum, tungsten, or copper, or other conductive material, such as polysilicon, and may include metal silicides, such as tungsten silicide. The conductive material may be deposited by, for example, chemical vapor deposition, including atomic layer deposition techniques, physical vapor deposition, including high density physical vapor deposition techniques, electrochemical deposition, including electroplating and electroless deposition techniques, or a combination of deposition techniques. The conductive material may also be deposited to a thickness between about 2,000 Å and about 4,000 Å, and may vary in thickness depending on the size of the structure to be fabricated.

Figure 2E:
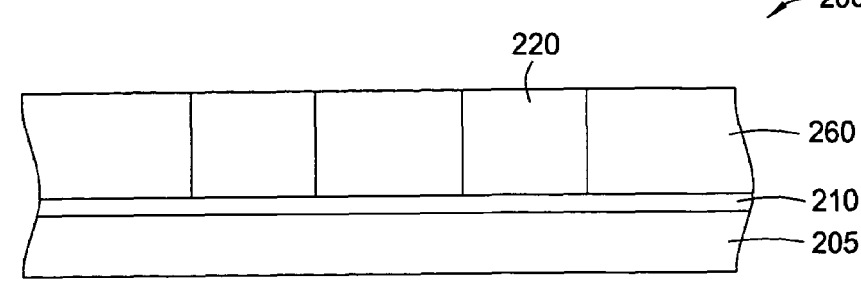

Dielectric materials including low k dielectric material may be also deposited in the feature definitions 270 as shown in FIG. 2E. An example of a gap-fill process with low k dielectric material is disclosed in U.S. Pat. No. 6,054,379, issued Apr. 25, 2000, which is incorporated herein by reference to the extent not inconsistent with the disclosure and claimed aspects herein. The gap fill deposition of a dielectric material, such as silicon oxide and silicon oxide-based materials, may be used for shallow trench isolation (STI) deposition processes. The dielectric material may also be deposited to a thickness between about 2,000 Å and about 4,000 Å, and may vary in thickness depending on the size of the structure to be fabricated.

The refractive index (n) and the absorption coefficient (k) (also referred to as the extinction coefficient) of the first and second amorphous carbon layers are tunable, in that they can be varied as a function of the temperature as well as the composition of the gas mixture during layer formation. When a combination of two amorphous carbon based anti-reflective coating layers are used, the hydrogen content may be adjusted accordingly to produce films having different hydrogen concentrations. For example, a higher content hydrogen ARC layer may be deposited with minimal or no concentration of fluorine in the amorphous carbon processing gas, while another layer having a higher absorption coefficient may have a higher fluorine concentration in the amorphous carbon processing gas. Further, the ARC layer may be deposited with a gradation of hydrogen content in the deposited layers, so that both ARC layers may be deposited continuously in situ by changing the fluorine concentration over time in the amorphous carbon processing gas. In such a gradation approach, one thick amorphous carbon layer having a graduated hydrogen concentration may be used in place of the multi-layer ARC stack.

Deposition of a Dual Damascene Structure

An example of a damascene structure that is formed using the low k dielectric silicon, oxygen, and carbon material, the amorphous carbon material, and the amorphous carbon material removal process described herein is shown in FIGS. 3A-3G, which are cross sectional views.

Figure 3A:
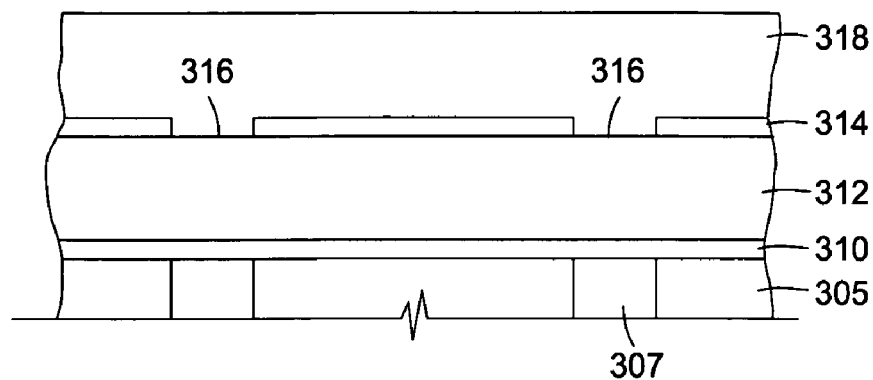
FIGS. 3A-3G are cross sectional views showing one embodiment of a dual damascene deposition sequence.

As shown in FIG. 3A, a silicon carbide barrier layer 310 is deposited on the substrate surface to eliminate inter-level diffusion between the substrate and subsequently deposited material. The substrate surface may comprise metal features 307 formed in a dielectric material 305. The silicon carbide barrier layer 310 may be doped with oxygen, boron, phosphorus, or combinations thereof.

A first dielectric layer 312, comprising silicon, oxygen, and carbon, as described herein is deposited on the silicon carbide barrier layer 310 on the substrate surface including metal features 307 formed in a dielectric material 305. The first dielectric layer 312 of interlayer dielectric material is deposited on the first silicon carbide barrier layer 310 by oxidizing an organosilane or organosiloxane, such as trimethylsilane, to a thickness of about 5,000 to about 15,000 Å, depending on the size of the structure to be fabricated.

An example of a low dielectric constant material that may be used as an interlayer dielectric material is Black Diamond™ dielectric material commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG). A plasma process following deposition as described herein for the silicon oxycarbide layer may then treat the first dielectric layer 312. An example of a low k dielectric constant layer and amorphous carbon layer stack is further disclosed in U.S. Pat. No. 6,541,397, issued Apr. 1, 2004, which is incorporated herein by reference to the extent not inconsistent with the disclosure and claimed aspects herein.

A low k etch stop (or second barrier layer) 314 of a silicon carbide material or oxidized organo silane layer is then deposited on the first dielectric layer 312 to a thickness of about 200 Å to about 1000 Å. Alternatively, the etch stop 314 may be a nitrogen containing silicon carbide material. The low k etch stop 314 is then pattern etched to define the contacVvia openings 316 and to expose first dielectric layer 312 in the areas where the contacts/vias are to be formed as shown in FIG. 3A. Preferably, the low k etch stop 314 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 314 prior to depositing further materials.

After the low k etch stop 314 has been etched to pattern the contacts/vias and the photoresist has been removed, a second dielectric layer 318 of silicon oxycarbide as described herein is deposited to a thickness of about 5,000 to about 15,000 Å as shown in FIG. 3A. The second dielectric layer 318 may also be plasma treated as described herein for the silicon oxycarbide layer.

In an alternative embodiment, a nitrogen-free silicon carbide or silicon oxide cap layer between about 100 Å and about 500 Å thick may be deposited on second dielectric layer 318 prior to depositing additional materials, such as photoresist materials. In a further alternative embodiment, a silicon carbide cap layer (not shown) may be deposited on the second dielectric layer 318 prior to depositing additional materials, such as photoresist materials.

Figure 3B:
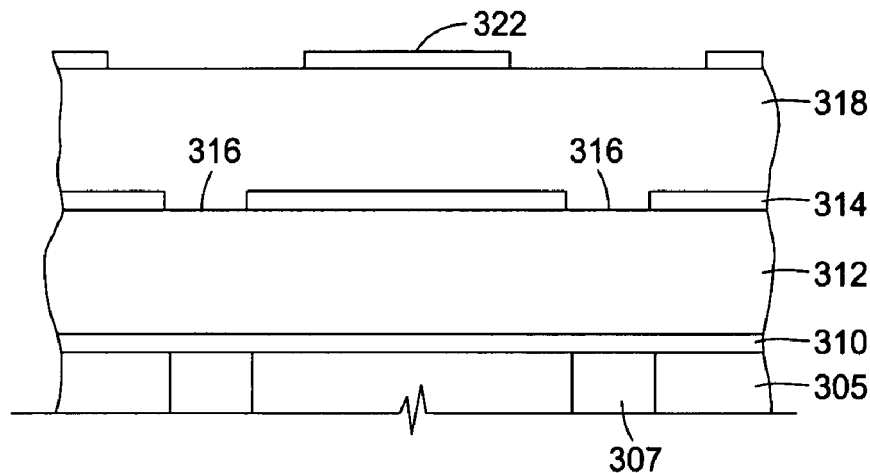

An amorphous carbon layer 322 is then deposited on the second dielectric layer 318 (or cap layer) and patterned preferably using conventional photolithography processes to define the interconnect lines 320 as shown in FIG. 3B. The amorphous carbon layer 322 is deposited as described herein. Typically, the amorphous carbon layer has a thickness in the range of about 50 Å to about 1000 Å.

The amorphous carbon layer 322 is a hardmask which may perform as a stop for chemical mechanical polishing techniques to allow removal of conductive material while protecting low k dielectric materials, such as the second dielectric layer 318, from damage during etching or from polishing methods. The amorphous carbon layer 322 may also function as an anti-reflective coating in addition to the hardmask. Further multiple layers of amorphous carbon may be used for the amorphous carbon layer 322. For example, the amorphous carbon bilayer ARC layer described herein may be used as the amorphous carbon layer 322.

Figure 3C:
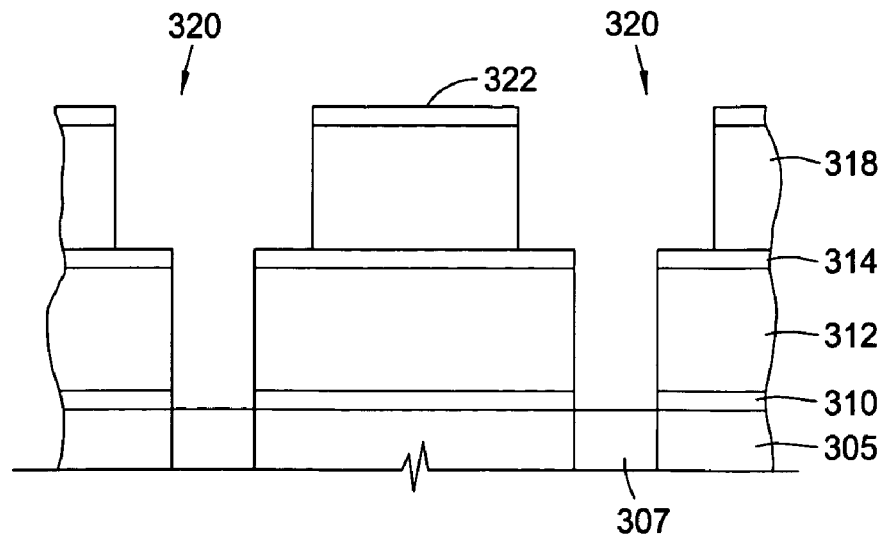

The features are then etched through the second dielectric layer 318, the low k etch stop 314, the first dielectric layer 312, and the silicon carbide barrier layer 310 as shown in FIG. 3C. The amorphous carbon layer has a selectivity, or removal rate ratio, to dielectric material as deposited underlying, of greater than about 1:10, such as between about greater than 1:10 and about 1:20, and can include removal rate ratios of greater than 1:30.

Figure 3D:
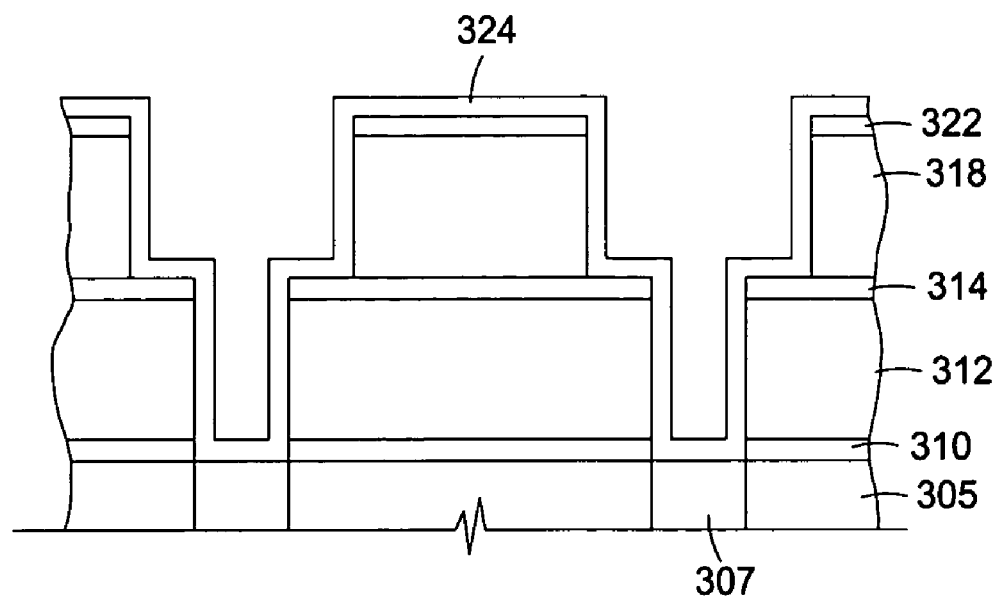
Figure 3E:
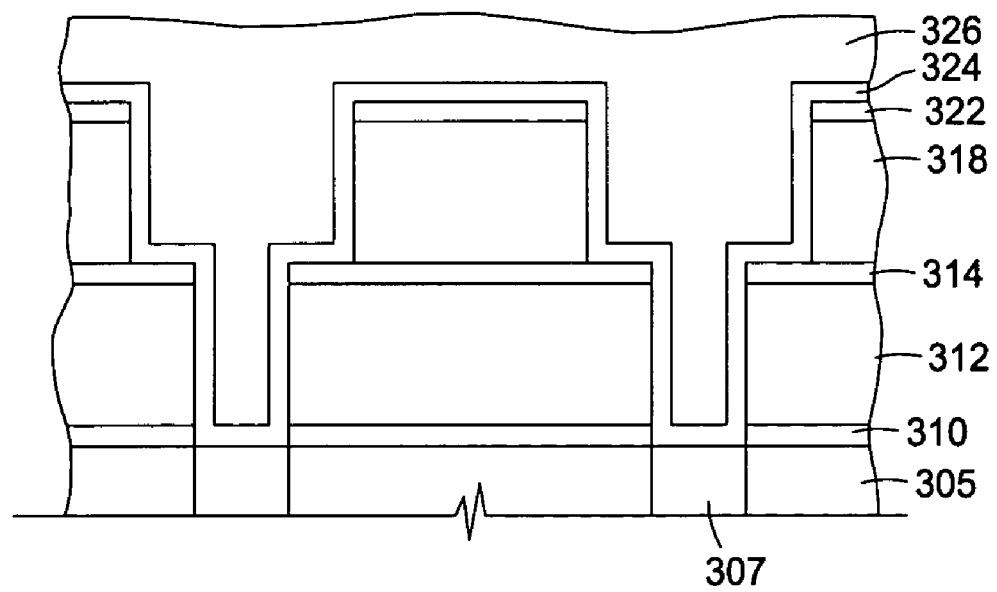

The interconnect lines 320 are filled to form a metallization structure with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 3D, a suitable barrier layer 324 such as tantalum or tantalum nitride is first deposited conformally in the metallization pattern to prevent copper migration into the surrounding silicon and/or dielectric material. Thereafter, copper 326 is deposited using either chemical vapor deposition, physical vapor deposition, electroplating, or combinations thereof to fill the structure as shown in FIG. 3E.

Figure 3F:
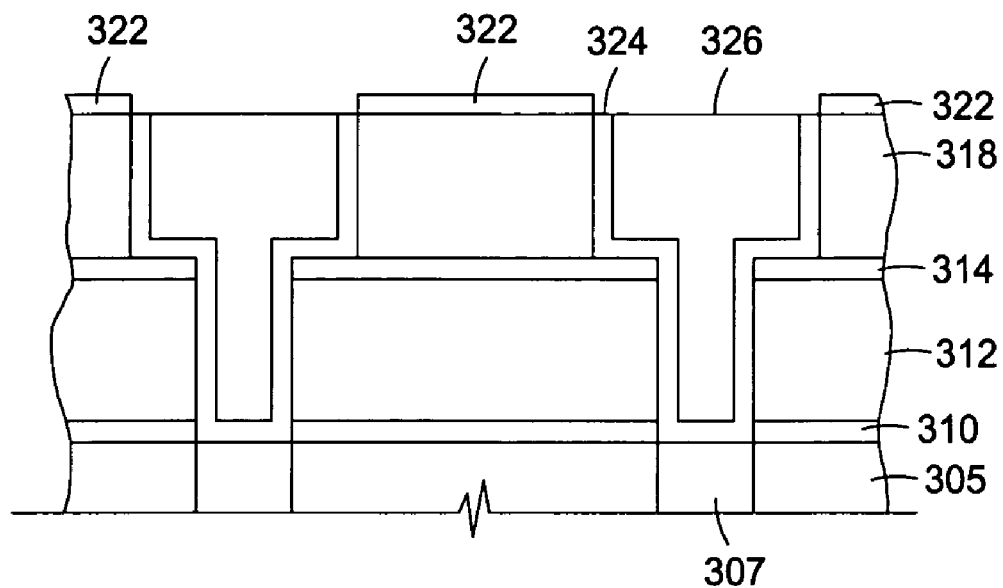
Figure 3G:
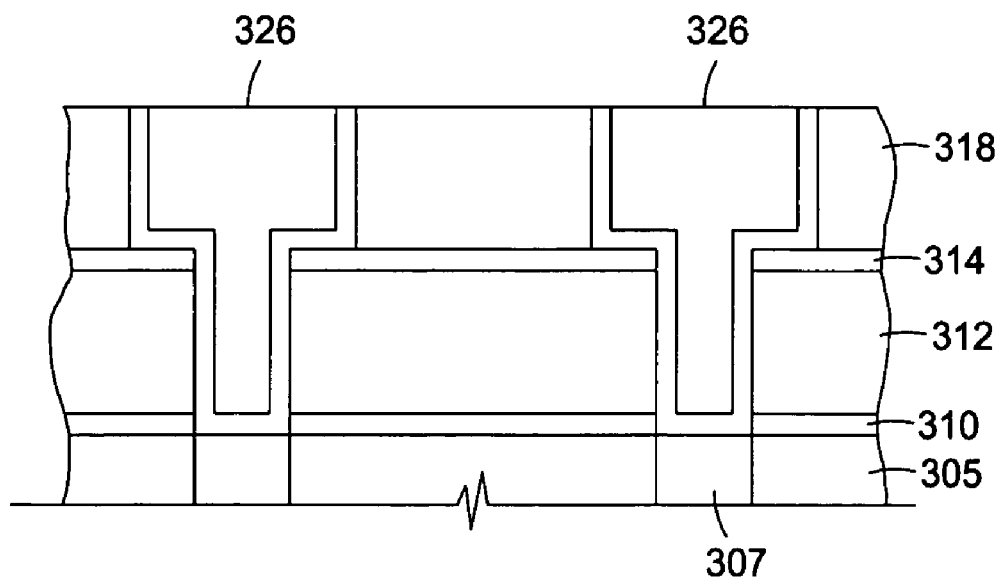

Once the structure has been filled with copper or other metal, the surface is planarized using chemical mechanical polishing to remove any excess copper 326 and barrier layer 324 materials. However, amorphous carbon layer 322 is polishing resistant and remains behind after the polishing process as shown in FIG. 3F. The amorphous carbon layer has a selectivity, or removal rate ratio, of conductive material, either copper or barrier layer materials, to amorphous carbon of greater than about 1:1, such as between about 5:1 and about 30:1, and can include removal rate ratios of greater than 30:1.

The amorphous carbon layer 322 is then exposed to a plasma of a hydrogen-containing gas to remove the amorphous containing material from the surface of the substrate. An example of the hydrogen-containing plasma removal process may be performed by introducing hydrogen gas at a flow rate of about 1000 sccm, maintaining a chamber pressure of about 5 Torr, maintaining a substrate temperature at about 250° C., generating a plasma by supplying a RF power level of between about 100 W and about 300 W for a 200 mm substrate, and maintaining the plasma for about 60 seconds, or as necessary to remove the amorphous carbon material. The gas distributor is positioned about 500 mils from the substrate surface during the plasma treatment.

Alternative Hardmask/Anti-Reflective Coating (ARC) Application

Figure 4:
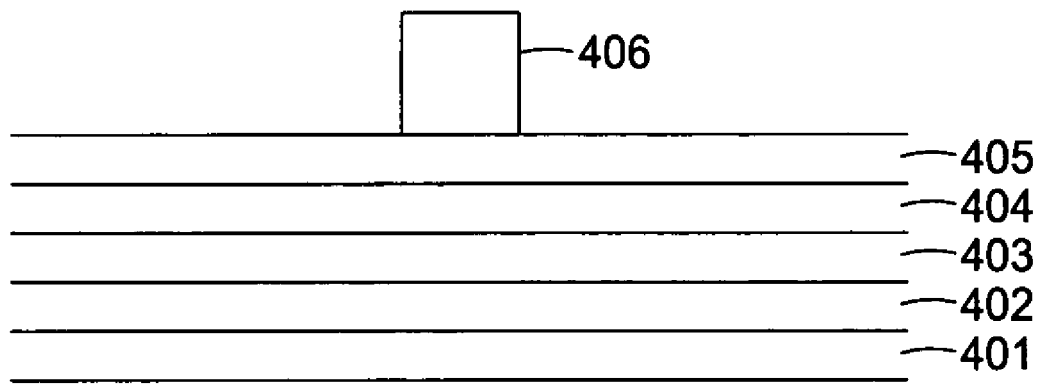
FIG. 4 is a cross sectional view of one embodiment of an amorphous carbon deposition process.

FIGS. 4 is a cross sectional view of one embodiment of an amorphous carbon deposition process at different stages of an integrated circuit fabrication sequence incorporating an amorphous carbon layer. The substrate structure 401 refers to the substrate together with other material layers formed on the substrate. Depending on the stage of processing, the substrate may correspond to a silicon substrate, or other material layer that has been formed on the substrate. FIG. 4 illustrates a substrate structure 401 having a material layer 402 that has been conventionally formed thereon. The material layer 402 may be an oxide (e.g., $SiO_2$). In general, the material layer 402 may include a layer of silicon, silicides, metals, or other materials. An amorphous carbon layer 403 is formed on the material layer 402 according to the process parameters described above. The thickness of the amorphous carbon layer is variable depending on the specific stage of processing. Typically, the amorphous carbon layer has a thickness in the range of about 50 Å to about 1000 Å.

FIG. 4 further illustrates an optional capping layer 404. Depending on the etch chemistry of the energy sensitive resist material used in the fabrication sequence, the optional capping layer 404 may be formed on the amorphous carbon layer 403. The optional capping layer 404 may function as a mask for the amorphous carbon layer 403 by transferring the pattern therein. The optional capping layer 404 may include an oxide, such as silicon oxide, a nitride, such as silicon nitride or titanium nitride, silicon oxynitride, silicon carbide, amorphous silicon, undoped silica glass (USG), doped silicon oxide, or other materials. The optional capping layer 404 may be deposited to a thickness between about 100 Å and about 1000 Å. However, layer thickness may vary depending on process requirements. The cap layer 404 is believed to protect the amorphous carbon layer from the photoresist as well as cover any layer imperfections, such as pinholes formed in the amorphous carbon material.

FIG. 4 further illustrates a spin-on material layer 405 and patterned photoresist 406. The spin-on material layer 405 may be any silicon containing dielectric material such as silicon, silicon fluoride, carbon doped silicon, fluorine doped silicon oxide, nitrogen doped silicon, or carbon doped silicon oxide. The spin-on material layer 405 may be deposited using a liquid based precursor that is applied to a rotating substrate surface. BARC™, a commercial process available from Applied Materials of Santa Clara, Calif. may also be used as the deposition process for the spin-on material layer 405.

A layer of energy sensitive resist material 406 is formed on the spin-on material layer 405. The layer of energy sensitive resist material 406 can be spin coated on the substrate to a thickness within the range of about 2000 Å to about 6000 Å. Most energy sensitive resist materials are sensitive to ultraviolet (UV) radiation having a wavelength less than about 450 nm. DUV resist materials are sensitive to UV radiation having wavelengths of 245 nm or 193 nm.

An image of a pattern is introduced into the layer of energy sensitive resist material 406 by exposing such energy sensitive resist material 108 to UV radiation via a mask (not shown). The image of the pattern introduced in the layer of energy sensitive resist material 406 is developed in an appropriate developer to define the pattern through such layer.

Additional Alternative Hardmask/Anti-Reflective Coating (ARC) Application

Figure 5:
FIG. 5 is a cross sectional view of an alternative embodiment of an amorphous carbon deposition process.

FIG. 5 is a cross sectional view of an alternative embodiment of an amorphous carbon deposition process at different stages of an integrated circuit fabrication sequence incorporating an amorphous carbon layer as a hardmask. In general, the substrate structure 501 refers to any workpiece on which processing is performed. Depending on the specific stage of processing, the substrate structure 501 may be a silicon substrate, or other material layer that has been formed on the substrate. FIG. 5, for example, illustrates a cross-sectional view of a substrate structure 501 that may also include a material layer that has been conventionally formed thereon. The substrate structure material layer may include an oxide (e.g., SiO$_2$). In general, the substrate structure 501 may include a layer of silicon, silicides, metals or other materials.

FIG. 5 further depicts an amorphous carbon layer 502 deposited on the substrate structure 501. The amorphous carbon layer 502 is formed on the substrate structure 501 according to the process parameters described above. The thickness of the amorphous carbon layer is variable depending on the specific processing conditions. Typically, the amorphous carbon layer has a thickness of about 50 Å to about 1000 Å.

Experimental Results

To illustrate how the hydrogen flow rate influenced the resulting film density, an amorphous carbon film was deposited with a hydrocarbon compound and hydrogen. All of the processing conditions were constant, except that the film was deposited with 1000 sccm hydrogen, 2000 sccm hydrogen, or 3000 sccm hydrogen. The density of the 1000 sccm hydrogen film was 1.44 g/cc, the density of the 2000 sccm hydrogen film was 1.47 g/cc, and the density of the 3000 sccm film was 1.54 g/cc. These results indicate that at higher hydrogen flow rates, a denser film is deposited. Film density is one estimate of carbon-carbon double bond formation. Thus, film deposition processes with higher hydrogen flow rates are more likely to form a film with increased likelihood of carbon-carbon double bonds.

A comparison of resulting films of three individual precursors at varied temperatures was performed wherein A-TRP is alpha-terpinene.

TABLE 1

Film Analysis Summary

| Analysis | Propylene | Propylene | A-TRP | Toluene |
|---|---|---|---|---|
| Deposition Temperature (° C.) | 450 | 550 | 450 | 450 |
| Density (XRR) g/cm$^3$ | 1.3 | 1.56 | 1.2 | 1.25 |
| RBS, C%/H% | 63/37 | 86/14 | 62.8/36.2 | — |
| FTIR (C—H/C—C) | 1 | 0.23 | 0.91 | 0.87 |
| Etch Selectivity to Oxide | 8:1 | 15:1 | 8:1 | 7.5:1 |
| K @ 633 nm | 0.22 | 0.45 | 0.10 | 0.08 |

The film formed using propylene at 550° C. had about twice the etch selectivity and about 20 percent higher density than the film formed using propylene at a lower temperature. The carbon-carbon bond concentration was also higher at higher temperature.

The propylene, A-TRP, and toluene precursors were also compared by using each precursor individually to form films at five varied temperatures from 350 to 550° C. The refractive index results for the films increased with increased temperature. The response curve of the refractive index as a function of temperature was different for each of the precursors. The dielectric constant for the A-TRP and toluene films was also measured. The dielectric constant increases as the film is deposited at higher temperature. Fourier Transform Infrared (FTIR) analysis was also performed on the resulting films. Films formed with propylene at a temperature higher than 400° C. had carbon-carbon double bonds.

In a separate set of experiments, the absorbance as a function of wave number was plotted for films deposited using toluene at 350, 400, 425, 450, and 500° C. The peaks on the curves indicate that carbon-carbon double bonds are formed and that formation of the double bonds only occurs at temperatures greater than 400° C. for films formed with toluene as a precursor.

Low frequency Rf power was examined as a way to tailor the density of amorphous carbon film. Rf power of 0, 50, 100, and 200 W were observed. When tested using toluene as the film precursor at both 350 and 450° C., the density of the film increased from around 1.17 to 1.28 g/cc. Low frequency Rf power can increase the density of amorphous patterned films. At 450° C., the extinction coefficient increased dramatically as the LFRF increased from 0 to 200 W. At 350° C., the extinction coefficient did not increase more than 0.05 as the LFRF increased from 0 to 800° C.

The films deposited using toluene as a precursor were measured and the absorbance as a function of wavenumbers for 0, 200, 400, 600, and 800 W LFRF was plotted. The 0 W LFRF film had the greatest number of wavenumbers at the peaks for —CH$_3$ bonds, —CH$_2$ bonds, and —CH bonds. The 800 W LFRF film had the lowest number of wavenumbers at the peak for —CH$_2$ bonds. The ratios of CH2/CH3 and CH/CH3 were consistent when comparing the LFRF trials. The wavenumber graph also shows that the benzene to CH3 ratio increases with increasing power to the LFRF. This indicates the presence of more benzene ring structures with increased power LFRF.

To observe how varying the temperature while keeping the LFRF at 800W influenced toluene film formation, films formed at 350, 375, 400, and 425° C. were measured using FTIR spectra. The plot of absorbance as a function of wavenumbers indicates that increasing the temperature of film formation lowers the likelihood of carbon carbon double bonds and yields a film with increased extinction coefficient.

The deposition rate as a function of LFRF was also observed. As the power to the LFRF was increased, the deposition rate increased linearly. Adding hydrogen to dilute the precursor decreased the deposition rate.

Different precursors were also compared. Toluene and alpha-terpenine provided the best film properties including optical properties and dielectric constant measurements at comparable temperature ranges. Using propylene and acetylene as precursors also provided films with acceptable optical properties and dielectric constant results. Toluene based films also provided the best step coverage as measured by SEM. Alpha-terpenine based films deposited at similar temperatures as the toluene based films have lower extinction coefficient measurements.

Low pressure film deposition was also tested. Lower pressure was desirable for providing uniform films as multiple substrates were tested. However, no detectable improvement in the film properties was observed.

While the foregoing is directed to embodiments of the present invention, other and further embodiments of the invention may be devised without departing from the basic scope thereof, and the scope thereof is determined by the claims that follow.

The invention claimed is:

1. A method for processing a substrate in a processing chamber, comprising:
   positioning the substrate in a processing chamber;
   introducing a processing gas into the processing chamber, wherein the processing gas comprises hydrogen and alpha-terpenine;
   generating a plasma of the processing gas by applying power from a dual-frequency RF source; and
   depositing an amorphous carbon layer on the substrate.

2. The method of claim 1, further comprising etching the amorphous carbon layer to form a patterned amorphous carbon layer.

3. The method of claim 2, further comprising removing the amorphous carbon layer from the substrate using a hydrogen-containing plasma, a nitrogen-containing plasma, an oxygen-containing plasma, or combinations thereof.

4. The method of claim 2, wherein the generating the plasma comprises applying a first RF power at a first frequency and applying a second RF power at a second frequency less than the first frequency.

5. The method of claim 4, wherein the generating the plasma comprises applying a first RF power at a first frequency between about 10 Mhz and about 30 Mhz and applying a second RF power at a second frequency between about 10 kHz and about 1 MHz.

6. The method of claim 5, wherein the ratio of second RF power to first RF power is less than about 0.6:1.

7. The method of claim 4, wherein the first RF power is from about 200 W to about 3000 W and the second RF power is from about 200 W to about 1000 W.

8. The method of claim 2, wherein the processing gas further comprises one or more fluorine based compounds selected from the group consisting of fluorine ($F_2$), nitrogen trifluoride ($NF_3$), $CHF_3$, $CH_2F_2$, and combinations thereof.

9. The method of claim 2, further comprising depositing an anti-reflective coating layer on the amorphous carbon layer, wherein the anti-reflective coating is a material selected from the group consisting of silicon nitride, silicon carbide, carbon-doped silicon oxide, amorphous carbon, and combinations thereof.

10. The method of claim 2, wherein the etch selectivity of amorphous carbon to the dielectric material is greater than about 1:7.

11. The method of claim 1, wherein the processing gas further comprises a carrier gas selected from the group consisting of helium (He), argon (Ar), Xenon (Xe) nitrogen ($N_2$) and combinations thereof.

12. A method for processing a substrate in a processing chamber, comprising:
    positioning the substrate in a processing chamber;
    introducing a processing gas into the processing chamber, wherein the processing gas comprises a carrier gas, hydrogen, and alpha-terpinene;
    generating a plasma of the processing gas by applying power from a dual-frequency RF source;
    depositing an amorphous carbon layer on the substrate;
    etching the amorphous carbon layer to form a patterned amorphous carbon layer;
    removing the one or more amorphous carbon layers; and
    depositing a conductive material on the surface of the substrate.

13. The method of claim 12, further comprising:
    depositing one or more anti-reflective coatings on the one or more amorphous carbon layers;
    patterning resist material on the anti-reflective coating; and
    etching the anti-reflective coating prior to or concurrent with etching the one or more amorphous carbon layers.

14. The method of claim 12, further comprising depositing a dielectric layer prior to depositing the conductive material.

15. The method of claim 12, further comprising depositing a barrier layer prior to depositing the conductive material.

16. A method for processing a substrate in a processing chamber, comprising:
    positioning the substrate in a processing chamber;
    introducing a processing gas into the processing chamber, wherein the processing gas comprises a carrier gas, hydrogen, and alpha-terpinene;
    generating a plasma of the processing gas by applying power from a dual-frequency RF source;
    depositing an amorphous carbon layer on the substrate defining a pattern in at least one region of the one or more amorphous carbon layers; and
    forming feature definitions in the one or more dielectric layers by the pattern formed in the at least one region of the one or more amorphous carbon layers.

17. The method of claim 16, further comprising removing the one or more amorphous carbon layers by exposing the one or more amorphous carbon layers to a plasma prior to depositing one or more conductive materials in the feature definitions, wherein the plasma is a gas selected from the group consisting of hydrogen containing gas, nitrogen containing gas, oxygen containing gas, and combinations thereof.

18. The method of claim 16, further comprising:
    polishing the one or more conductive materials and stopping on the one or more amorphous carbon layers; and
    removing the one or more amorphous carbon layers by exposing the one or more amorphous carbon layers to a plasma of a hydrogen-containing gas.

19. The method of claim 16, further comprising:
    depositing an anti-reflective coating on the one or more amorphous carbon layers;
    patterning resist material on the anti-reflective coating; and
    etching the anti-reflective coating prior to or concurrent with etching the one or more amorphous carbon layers.

20. The method of claim 16, further comprising depositing a third amorphous carbon layer on the second amorphous carbon layer by a method comprising:
    introducing a processing gas into the processing chamber, wherein the processing gas comprises one or more aliphatic hydrocarbon compounds; and
    generating a plasma of the processing gas.

* * * * *

UNITED STATES PATENT AND TRADEMARK OFFICE
CERTIFICATE OF CORRECTION

PATENT NO. : 7,407,893 B2
APPLICATION NO. : 11/065464
DATED : August 5, 2008
INVENTOR(S) : Seamons et al.

It is certified that error appears in the above-identified patent and that said Letters Patent is hereby corrected as shown below:

Title Page
In Other Publications:

Please insert --Liu et al., "Generating Sub-30nm Poly-Silicon Gates Using PECVD Amorphous Carbon as Hardmask and Anti-Reflective Coating", Proceedings of the SPIE, BELLINGHAM, VA, US, vol. 5040, no. 1, February 25, 2003, pages 841-848.--;

Please insert --PCT Written Opinion dated May 31, 2005 for PCT/US05/008070.--;

In the Detailed Description:

Column 7, Line 30, please delete "Flourine" and insert --Fluorine-- therefor;

Column 17, Line 14, please delete "contacVvia" and insert --contact/via-- therefor;

In the Claims:

Column 21, line 35, please delete "2" and insert --1-- therefor;

Column 21, line 39, please delete "2" and insert --1-- therefor;

Column 21, line 53, please delete "2" and insert --1-- therefor;

Column 21, line 57, please delete "2" and insert --1-- therefor;

Signed and Sealed this

Eighteenth Day of August, 2009

David J. Kappos
*Director of the United States Patent and Trademark Office*

UNITED STATES PATENT AND TRADEMARK OFFICE
CERTIFICATE OF CORRECTION

PATENT NO. : 7,407,893 B2
APPLICATION NO. : 11/065464
DATED : August 5, 2008
INVENTOR(S) : Seamons et al.

Page 1 of 1

It is certified that error appears in the above-identified patent and that said Letters Patent is hereby corrected as shown below:

Title Page
In Other Publications:

Please insert --Liu et al., "Generating Sub-30nm Poly-Silicon Gates Using PECVD Amorphous Carbon as Hardmask and Anti-Reflective Coating", Proceedings of the SPIE, BELLINGHAM, VA, US, vol. 5040, no. 1, February 25, 2003, pages 841-848.--;

Please insert --PCT Written Opinion dated May 31, 2005 for PCT/US05/008070.--;

In the Detailed Description:

Column 7, Line 30, please delete "Flourine" and insert --Fluorine-- therefor;

Column 17, Line 14, please delete "contacVvia" and insert --contact/via-- therefor;

In the Claims:

Column 21, line 33, please delete "2" and insert --1-- therefor;

Column 21, line 37, please delete "2" and insert --1-- therefor;

Column 21, line 51, please delete "2" and insert --1-- therefor;

Column 21, lines 55 and 61, please delete "2" and insert --1-- therefor;

This certificate supersedes the Certificate of Correction issued August 18, 2009.

Signed and Sealed this

Ninth Day of February, 2010

David J. Kappos
*Director of the United States Patent and Trademark Office*